United States Patent [19]

Paneth

[11] Patent Number: 4,862,107

[45] Date of Patent: * Aug. 29, 1989

[54] FREQUENCY SYNTHESIZER FOR BROADCAST TELEPHONE SYSTEM HAVING MULTIPLE ASSIGNABLE FREQUENCY CHANNELS

[75] Inventor: Eric Paneth, Givataiim, Israel

[73] Assignee: International Mobile Machines Corporation, Philadelphia, Pa.

[ * ] Notice: The portion of the term of this patent subsequent to Nov. 15, 2005 has been disclaimed.

[21] Appl. No.: 211,758

[22] Filed: Jun. 27, 1988

Related U.S. Application Data

[63] Continuation of Ser. No. 840,908, Mar. 18, 1986, Pat. No. 4,785,260.

[51] Int. Cl.[4] .............................................. H03L 7/00
[52] U.S. Cl. .......................................... 331/2; 331/25
[58] Field of Search ............... 331/2, 18, 25; 379/253, 379/280, 284

[56] References Cited

U.S. PATENT DOCUMENTS 3,546,617  11/1968  Westwood .............................. 331/2
4,785,260  11/1988  Paneth ................................... 331/2

Primary Examiner—Eugene R. LaRoche
Assistant Examiner—Robert J. Pascal
Attorney, Agent, or Firm—Arthur A. Jacobs; Edward W. Callan

[57] ABSTRACT

In a broadcast telephone system for communicating information signals over an assigned frequency channel, the combination of a synthesizer for generating a signal at the assigned frequency and a PROM storing a plurality of sets of first and second signals associated with different predetermined assignable frequencies. The synthesizer includes a first phase-locked loop for generating an output signal at a frequency within a first predetermined range including the plurality of assignable frequencies in response to the combination of a first frequency reference signal having a predetermined frequency and a second reference frequency signal having a frequency within a second predetermined range and derived from a second phase-locked loop a second phase-locked loop for generating a third reference frequency signal within a third predetermined range in response to a combination of a first signal from the PROM associated with a given assignable frequency and a fourth frequency reference signal having a predetermined frequency; and a frequency divider coupled to the PROM for dividing the frequency of the output signal from the second phase-locked loop by an amount indicated by a second signal from the PROM associated with said given assignable frequency to provide the second reference signal to the first phase-locked loop. The phase-locked loops each include a minimizing phase noise and electronic noise due to microphonics.

2 Claims, 2 Drawing Sheets

FREQUENCY SYNTHESIZER FOR BROADCAST TELEPHONE SYSTEM HAVING MULTIPLE ASSIGNABLE FREQUENCY CHANNELS

This is a continuation, of application Ser. No. 06/840,908, filed Mar. 18, 1986 now U.S. Pat. No. 4,785,260.

BACKGROUND OF THE INVENTION

The present invention generally pertains to frequency synthesis and is particularly directed to an improved frequency synthesizer for use in a broadcast telephone system in which information signals are communicated over an assigned frequency channel.

Frequency synthesizers typically include one or more phase-locked loops for generating a signal having a given frequency. Multiple interdependent phase-locked loops are used to improve frequency resolution.

In a broadcast telephone system it is desirable to have the capability of being able to assign any given broadcast to one of a plurality of different frequency channels.

In typical off-the-shelf commercially available frequency synthesizers the frequency is assigned by manual adjustment of controls, such as push buttons or the like. However, a broadcast telephone system typically includes far more subscribers than available frequency channels, and it is preferred that the frequency for any given broadcast be assigned automatically in accordance with availability.

Also, when a typical off-the-shelf commercially available frequency synthesizer is used in a broadcast telephone system, phase noise and electronic noise due to microphonics are introduced into the frequency synthesizer. The term "microphonics" refers to the induction of electrical signals as a result of sound waves such as are introduced by mechanical vibrations, such as those caused by cooling fans.

SUMMARY OF THE INVENTION

The present invention provides a combination of a frequency synthesizer and a read-only memory (ROM) in a broadcast telephone system, wherein the frequency synthesizer automatically generates a signal having an assigned frequency within a predetermined range of assignable frequencies in response to signals stored in the ROM that are associated with different assignable frequencies within the predetermined range.

The frequency synthesizer in the combination of the present invention includes a filter having a passband that is adapted for minimizing phase noise and electronic noise due to microphonics.

More specifically, the ROM stores a plurality of sets of first and second signals associated with different predetermined assignable frequencies, and the synthesizer includes a first phase-locked loop connected to a second phase-locked loop for enhancing frequency resolution. The first phase-locked loop includes a first voltage-controlled oscillator (VCO) for generating an output signal at a frequency within a first predetermined range including the plurality of assignable frequencies; a mixer for mixing the output signal from the first VCO with a first frequency reference signal having a predetermined frequency that is derived from a common reference frequency signal; a low-pass filter for passing the low-frequency product from the mixer; a first phase comparator for comparing the passed low-frequency product with a second reference frequency signal having a frequency within a second predetermined range and derived from a second phase-locked loop, and for providing a first voltage signal indicating the result of said comparison; and a first band-pass filter for passing the first voltage signal to the first VCO for controlling the first VCO, wherein the passband of the first band-pass filter is adapted for minimizing phase noise and electronic noise due to microphon-ig. The second phase-locked loop includes a second VCO for generating a third reference frequency signal within a third predetermined range; a first frequency divider coupled to the ROM for dividing the frequency of the output signal from the second VCO by an amount indicated by a first signal from the ROM associated with a given assignable frequency; a second phase comparator for comparing the divided output signal from the second VCO with a fourth frequency reference signal having a predetermined frequency that is derived from said common frequency reference signal and for providing a second voltage signal indicating the result of said comparison; and a second band-pass filter for passing the second voltage signal to the second VCO for controlling the second VCO, wherein the passband of the second band-pass filter is adapted for minimizing phase noise and electronic noise due to microphonics. The synthesizer also includes a second frequency divider, which is coupled to the ROM for dividing the frequency of the output signal from the second VCO by an amount indicated by a second signal from the ROM associated with said given assignable frequency to provide the second reference frequency signal to the first phase comparator.

Additional features of the invention are described with reference to the description of the preferred embodiment.

DESCRIPTION OF THE PREFERRED EMBODIMENT

Figure 1:
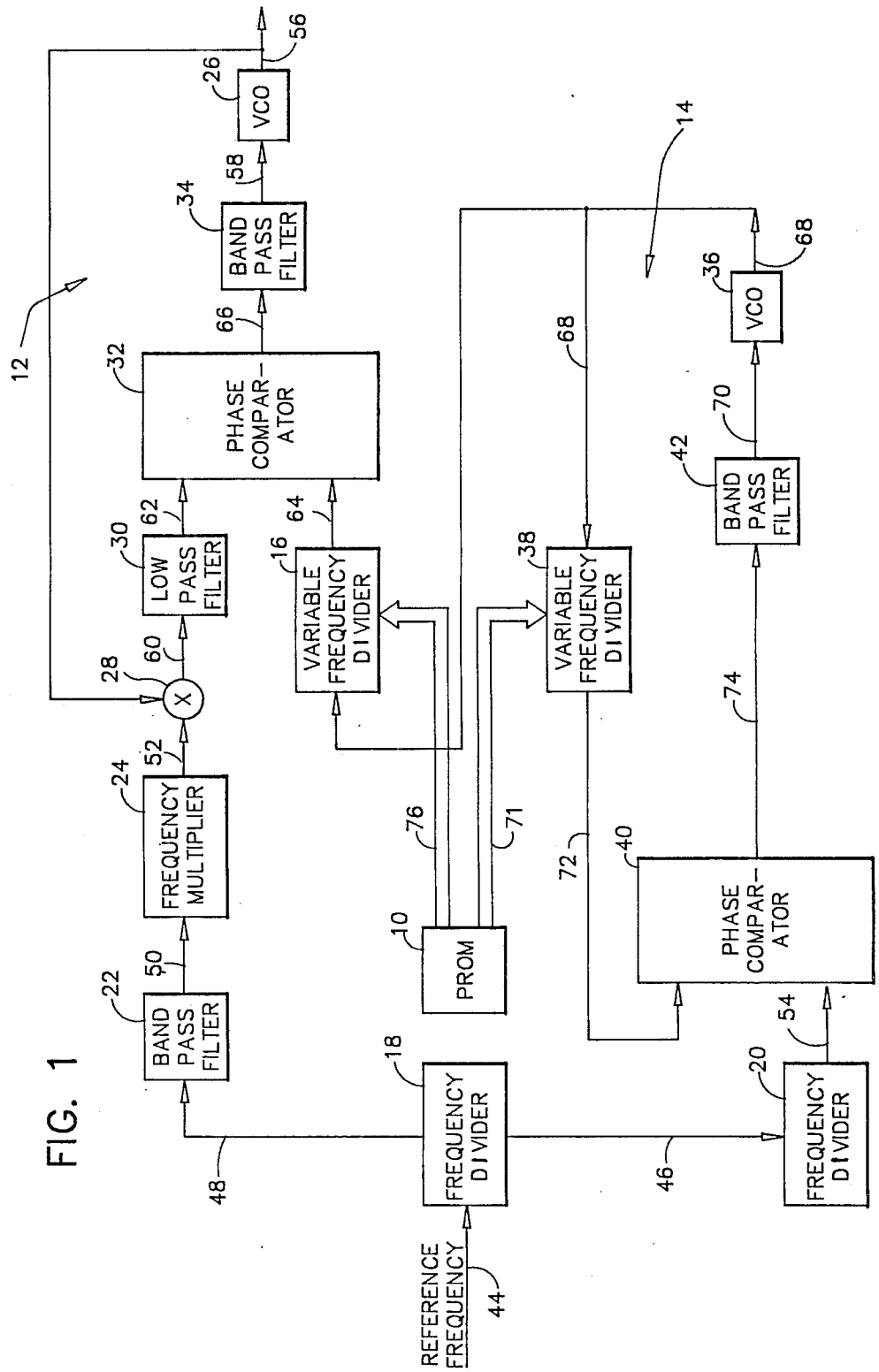
FIG. 1 is block diagram of the combination of a ROM and synthesizer according to the present invention.

Referring to FIG. 1, the preferred embodiment of the combination of the present invention includes a ROM 10, a first phase-locked loop 12, a second phase-locked loop 14, a variable frequency divider 16, a first fixed frequency divider 18, a second fixed frequency divider 20, a band-pass filter 22 and a frequency multiplier 24.

The ROM 10 is a programmable-read-only memory (PROM). The PROM 10 stores a plurality of sets of first and second signals associated with different predetermined assignable frequencies. The particular frequency to be assigned is determined by a computer (not shown) in the telephone broadcast system; which computer then addresses the PROM 10 to access the set of signals associated with the assigned frequency. The first phase-locked loop 12 includes a first VCO 26, a mixer 28, a low-pass filter 30, a phase comparator 32 and a first band-pass filter 34. The second phase-locked loop 14 includes a second VCO 36, a variable frequency divider 38, a phase comparator 40 and a second band-pass filter 42. A common reference frequency signal is provided on line from a source (not shown) within the telephone broadcast system. In the preferred embodiment, the common reference frequency of the signal on line 44 is 80 MHz. (The frequency and component parameters described herein are those that are applicable to a specific preferred embodiment of the present invention. Clearly, different parameters will be applicable to alternative embodiments of this invention.)

The first fixed frequency divider 18 divides the 80 MHz common reference frequency signal on line 44 by five to provide a 16 MHz signal on line 46 to the second frequency divider 20 and on line 48 to the band-pass filter 22. Each frequency divider 16, 18, 20, 38 may include one or more discrete frequency division units. When a plurality of discrete frequency division units are included in a frequency divider, the discrete units are connected in series and the divisor of the frequency divider is the product of the divisors of the discrete series-connected frequency division units.

The band-pass filter 22 has a very narrow passband centered at 48 MHz for passing on to line 50 the third harmonic of the 16 MHz signal on line 48.

The frequency multiplier 24 multiplies the frequency of the signal on line 50 by nine to provide a frequency reference signal at 432 MHz on line 52. The frequency multiplier 24 may include two series-connected frequency multiplication units that each have a multiplier of three.

The second fixed frequency divider 20 divides the 16 MHz signal on line 46 by forty to provide a frequency reference signal at 400 KHz on line 54.

Referring to the first phase-locked loop 12, the first VCO 26 generates a first output signal at a frequency within a range of from 433.825 MHz to 439.650 MHz in accordance with the level of a first voltage signal received by the VCO input on line 58. The predetermined assignable frequencies in this range are incrementally separated by 25 KHz.

The mixer 28 mixes the output signal on line 56 from the first VCO with the 432 MHz frequency reference signal on line 52 to provide a spectrum of mixer products on line 60.

The low-pass filter 30 passes the low-frequency product from the mixer 28 to line 62. The low-pass filter has a cut-off frequency of 11 MHz and passes a product within a frequency range of from 1.825 MHz to 7.650 MHz.

The first phase comparator 32 compares the passed low-frequency product on line 62 with a reference frequency signal on line 64 having a frequency within a range of from 1.518 MHz to 8 MHz. The reference signal on line 64 is derived from the second phase-locked loop 14. The first phase comparator 32 provides a first voltage signal on line 66 to indicate the result of the comparison.

Figure 2:
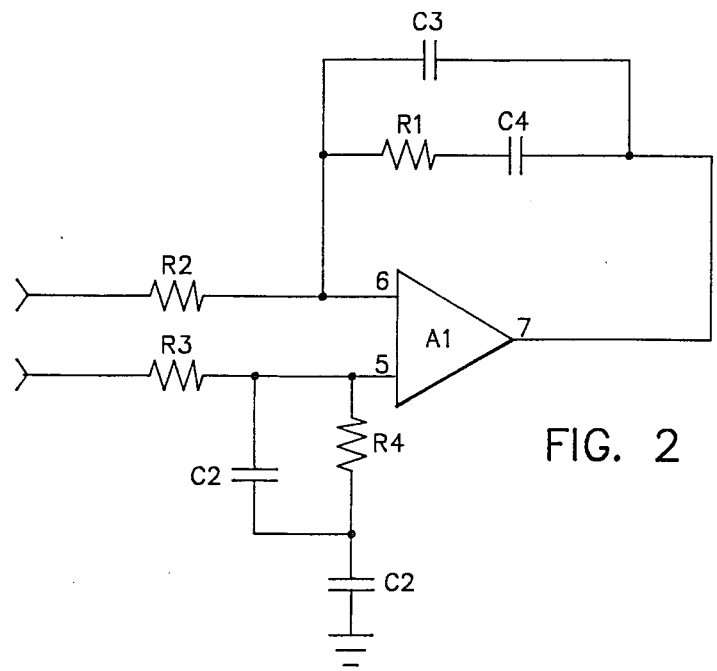
FIG. 2 is a schematic circuit diagram of the band-pass filter in the first phase-locked loop of the synthesizer shown in FIG. 1.

The first band-pass filter 34 passes the first voltage signal to the first VCO 26 via line 58 for controlling the first VCO 26. The passband of the first band-pass filter 34 is adapted for minimizing phase noise and electronic noise due to microphonics by a technique of providing a wide bandwidth, as is known to those skilled in the art. The passband of the filter 34 is from approximately 200 KHz to 350 KHz. The schematic circuit diagram of the first band-pass filter 34 is shown in FIG. 2. The band-pass filter of FIG. 2 includes an operational amplifier A1, which is one-half of a Model NE5532 dual-operational-amplifier integrated circuit. The values of the remaining components of the filter of FIG. 2 are shown in the following Table I.

TABLE I

| | |
|---|---|
| R1 | 8.06 Kohms, 1%, 1/10 W |
| R2 | 2.0 Kohms, 1%, 1/10 W |
| R3 | 2.0 Kohms, 1%, 1/10 W |
| R4 | 8.06 Kohms, 1%, 1/10 W |
| C1 | 0.1 uf |
| C2 | 56 pf |
| C3 | 56 pf |
| C4 | 0.1 uf |

Referring to the second phase-locked loop 14, the second VCO 36 generates a reference frequency signal on line 68 within a predetermined range in accordance with the level of a second voltage signal provided on line 70 to the input of the second VCO 36.

The variable frequency divider 38 is coupled to the PROM 10 for dividing the frequency of the output signal on line 68 from the second VCO 36 by an amount indicated by a first signal on lines 71 from the PROM 10 associated with a given assigned frequency.

The second phase comparator 40 compares the divided output signal on line 72 with the 400 KHz frequency reference signal on line 54 and provides a second voltage signal indicating the result of said comparison on line 74.

Figure 3:
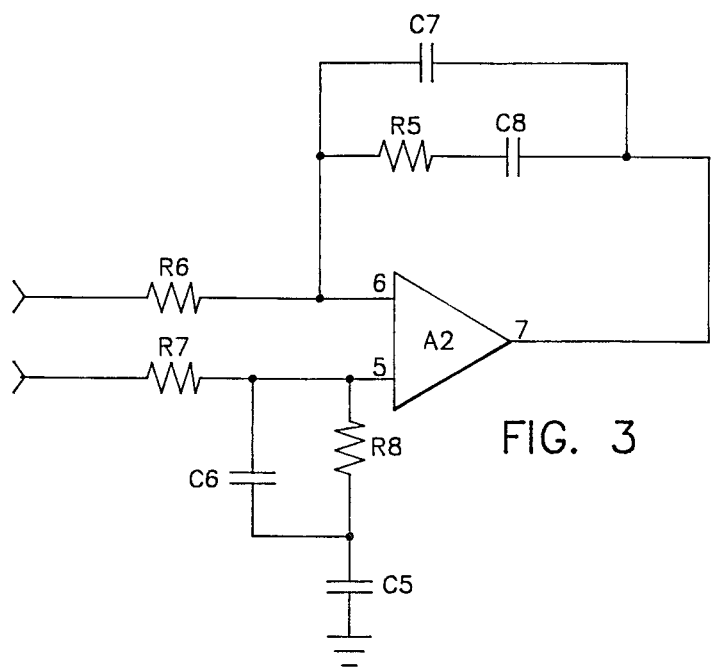
FIG. 3 is a schematic circuit diagram of the band-pass filter in the second phase-locked loop of the synthesizer shown in FIG. 1.

The second band-pass filter 42 passes the second voltage signal on line 74 to the second VCO 36 via line 70 to control the second VCO 36. The passband of the second band-pass filter 42 is adapted for minimizing phase noise and electronic noise due to microphonics by a technique of providing a wide bandwidth, as is known to those skilled in the art. The passband of the filter 42 is from approximately 200 KHz to 350 KHz. The schematic circuit diagram of the second band-pass filter 42 is shown in FIG. 3. The band-pass filter of FIG. 3 includes an operational amplifier A2, which is one-half of a Model NE5532 dual-operational-amplifier integrated circuit. The values of the remaining components of the filter of FIG. 3 are shown in the following Table II.

TABLE II

| | |
|---|---|
| R5 | 8.06 Kohms, 1%, 1/10 W |
| R6 | 2.0 Kohms, 1%, 1/10 W |
| R7 | 2.0 Kohms, 1%, 1/10 W |
| R8 | 8.06 Kohms, 1%, 1/10 W |
| C5 | 0.1 uf |
| C6 | 200 pf |
| C7 | 200 pf |
| C8 | 0.1 uf |

The variable frequency divider 16 is coupled to the PROM 10 for dividing the frequency of the output signal on line 68 from the second VCO 36 by an amount indicated by a second signal on line 76 from the PROM 10 associated with the given assigned frequency to provide the reference frequency signal on line 64 to the first phase comparator 32.

I claim:

1. In a broadcast telephone system for communicating information signals over an assigned frequency channel, the combination of a synthesizer for generating a signal at the assigned frequency and a read-only memory (ROM) storing a plurality of sets of first and second signals associated with different predetermined assignable frequencies, the synthesizer comprising a first phase-locked loop for generating an output signal at a frequency within a first predetermined range including the plurality of assignable frequencies in response to the combination of a first frequency reference signal having a predetermined frequency and a second reference frequency signal having a frequency within a second predetermined range and derived from a second phase-locked loop, wherein the first phase-locked loop includes a first band-pass filter having a passband adapted for minimizing phase noise and electronic noise due to microphonics;

said second phase-locked loop generating a third reference frequency signal within a third predetermined range in response to a combination of a first signal from the ROM associated with a given assignable frequency and a fourth frequency reference signal having a predetermined frequency, wherein the second phase-locked loop includes a second band-pass filter having a passband adapted for minimizing phase noise and electronic noise due to microphonics; and a frequency divider coupled to the ROM for dividing the frequency of the output signal from the second phase-locked loop by an amount indicated by a second signal from the ROM associated with said given assignable frequency to provide the second reference frequency signal to the first phase-locked loop.

2. A combination according to claim 1, wherein the ROM is a programmable-read-only memory (PROM).

* * * * *